United States Patent
Tu et al.

(10) Patent No.: US 6,764,942 B2
(45) Date of Patent: Jul. 20, 2004

(54) RE-OXIDATION PROCESS OF SEMICONDUCTOR DEVICE

(75) Inventors: Jui-Neng Tu, Hsinchu (TW); June-Min Yao, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/065,919
(22) Filed: Nov. 29, 2002
(65) Prior Publication Data
US 2004/0106281 A1 Jun. 3, 2004

(51) Int. Cl.7 .......................................... H01L 21/4763
(52) U.S. Cl. ..................................... 438/635; 438/680
(58) Field of Search ............................ 438/635, 641, 438/664, 680, 754, 755, 233, 400, 704, 739

(56) References Cited

U.S. PATENT DOCUMENTS 6,124,153 A * 9/2000 Lee et al.
6,136,666 A * 10/2000 So
6,486,067 B1 * 11/2002 Shen et al.
6,515,328 B1 * 2/2003 Yang et al.

* cited by examiner

Primary Examiner—Phuc T. Dang
(74) Attorney, Agent, or Firm—Jiang Chyun IP Office

(57) ABSTRACT

A re-oxidation process of a semiconductor device is described. A substrate having a stacked structure thereon is provided, wherein the stacked structure includes a polysilicon/tungsten silicide interface. A thin CVD oxide layer is formed on the substrate and the stacked structure with a chemical vapor deposition (CVD) process. Then, an oxidation process is performed to form a thermal oxide layer on the substrate and the stacked structure.

20 Claims, 2 Drawing Sheets

RE-OXIDATION PROCESS OF SEMICONDUCTOR DEVICE

BACKGROUND OF INVENTION

1. Field of Invention

The present invention relates to a semiconductor process. More particularly, the present invention relates to a re-oxidation process of a semiconductor device that includes a polysilicon/tungsten suicide (WSi) stacked structure.

2. Description of Related Art

In current MOS (metal-oxide-semiconductor) process, polycide gates having polysilicon/metal suicide stacked structures are frequently formed to lower the resistance. After polycide gates are formed by patterning/etching a metal silicide layer and a polysilicon layer deposited on a substrate, the substrate is usually subjected to a re-oxidation process to eliminate the damage caused by the deposition process and the etching process. For example, the re-oxidation process is capable of eliminating the damage in a gate oxide layer to recover the gate oxide integrity.

However, in a re-oxidation process performed after the etching process of polysilicon/tungsten suicide stacked gates, fast oxidation easily occurs on the surfaces of the polysilicon layer and the tungsten silicide layer to cause specific migration paths at the polysilicon/tungsten silicide interface. The underlying polysilicon is pumped-up through the migration paths, so voids are formed at the interface between the polysilicon layer and the tungsten silicide layer. Consequently, the resistance of the polycide gates are remarkably changed, and the device properties are not uniform.

Referring to FIG. 3, which shows a TEM image of a cross section of a polysilicon/tungsten suicide stacked gate after a re-oxidation process in the prior art. It is noted that a void is formed at the interface between the tungsten suicide (WSi) layer and the polysilicon (Poly) layer.

SUMMARY OF INVENTION

Accordingly, this invention provides a re-oxidation process of a semiconductor device that includes a polysilicon/tungsten silicide stacked structure. With the re-oxidation process of this invention, void formation at the polysilicon/tungsten silicide interface can be effectively prevented.

The re-oxidation process of a semiconductor device of this invention is briefly described below. A substrate having a stacked structure thereon is provided, wherein the stacked structure includes a polysilicon/tungsten silicide interface. A thin CVD oxide layer is formed on the substrate and the stacked structure with a chemical vapor deposition (CVD) process, such as a low-pressure chemical vapor deposition (LPCVD) process or a plasma-enhanced chemical vapor deposition (PECVD) process, using silane ($SiH_4$), TEOS (tetraethyl-ortho-silane) or dichlorosilane ($SiH_2Cl2$) as a Si-source. Then, an oxidation process is performed to form a thermal oxide layer on the substrate and the stacked structure.

Based on the aforementioned re-oxidation process, this invention also provides a method for fabricating a semiconductor device that includes a polysilicon/tungsten suicide stacked gate. In the method, a tunneling layer, a first polysilicon layer, an inter-poly dielectric layer, a second polysilicon layer and a tungsten silicide layer are sequentially formed on a substrate. The above layers are then patterned sequentially to form a stacked gate that comprises a tunneling layer, a polysilicon floating gate, an inter-poly dielectric layer, a polysilicon control gate and a tungsten silicide layer. A thin CVD oxide layer is formed on the substrate and the stacked gate with a chemical vapor deposition (CVD) process. Thereafter, an oxidation process is performed to form a thermal oxide layer on the substrate and the stacked gate.

This invention further provides another method for fabricating a semiconductor device that includes a polysilicon/tungsten silicide stacked gate. In the method, a gate dielectric layer, a polysilicon layer and a tungsten silicide layer are sequentially formed on a substrate. The above layers are then patterned sequentially to form a stacked gate, wherein the polysilicon layer is patterned into a polysilicon gate. Thereafter, the substrate is subjected to the aforementioned re-oxidation process of this invention.

In this invention, the thin CVD oxide layer can prevent fast oxidation on exposed surfaces of the tungsten silicide layer and the polysilicon layer, so pumping-up paths for underlying polysilicon are not created. Therefore, void formation at the polysilicon/tungsten silicide interface can be prevented effectively.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
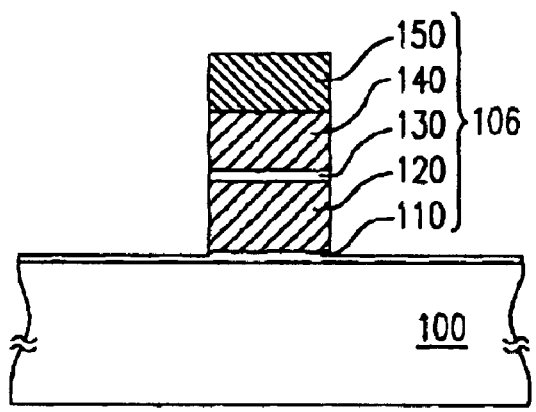
FIGS. 1A~1C illustrate a process flow of a re-oxidation process of a semiconductor device that includes a polysilicon/tungsten silicide stacked structure according to a preferred embodiment of this invention.
Figure 1B:
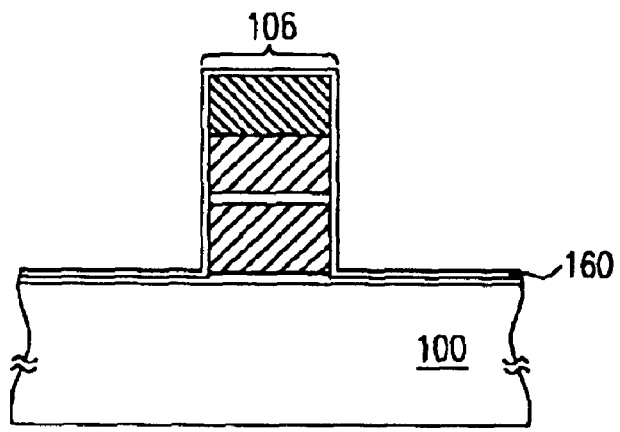
Figure 1C:
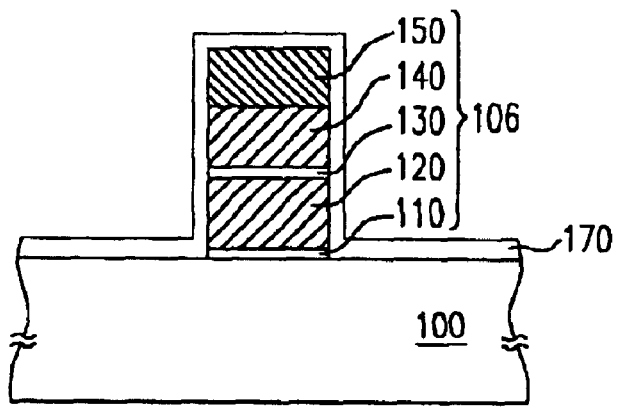

FIGS. 1A~1C illustrate a process flow of a re-oxidation process of a semiconductor device that includes a polysilicon/tungsten silicide stacked structure according to a preferred embodiment of this invention.

Referring to FIG. 1A, a substrate 100 is provided, and a tunneling layer 110, a polysilicon layer 120, an inter-poly dielectric layer 130, a polysilicon layer 140 and a tungsten suicide layer 150 are sequentially formed on the substrate 100. The above layers are then patterned to form a stacked gate 106 comprising, from bottom to top, a tunneling layer 110, a polysilicon floating gate 120, an inter-poly dielectric layer 130, a polysilicon control gate 140 and a tungsten silicide layer 150. The tunneling layer 110 comprises, for example, a thermal oxide layer having a thickness from 20 Å to 50 Å. The polysilicon layers 120 and 140 are formed with a method such as LPCVD. The Inter-poly dielectric layer 130 comprises, for example, an oxide/nitride/oxide (ONO) composite layer. The tungsten suicide layer 150 is formed with a method such as LPCVD using reaction gases such as $SiH_4$ and $WF_6$.

Referring to FIG. 1B, a thin CVD oxide layer 160 is formed on the substrate 100 and the stacked gate 106 with a CVD process, such as a low-pressure chemical vapor deposition (LPCVD) process or a plasma enhanced chemical vapor deposition (PECVD) process. The CVD process may use silane ($SiH_4$), TEOS (tetraethyl-ortho-silane) or dichlorosilane ($SiH_2Cl_2$) as a Si-source to react with an oxidizer, such as $N_2O$, $O_2$ or $O_3$, to form silicon oxide. In addition, the thin CVD oxide layer 160 has a thickness from 30 Å to 120 Å, for example.

Referring to FIG. 1C, an oxidation process is performed to form a thermal oxide layer 170 that incorporates the CVD oxide layer 160. The oxidation process is conducted under $O_2$, $H_2O$ or $O_2/H_2O$ atmosphere in a batch-type or single wafer-type reaction chamber, for example.

Figure 2:
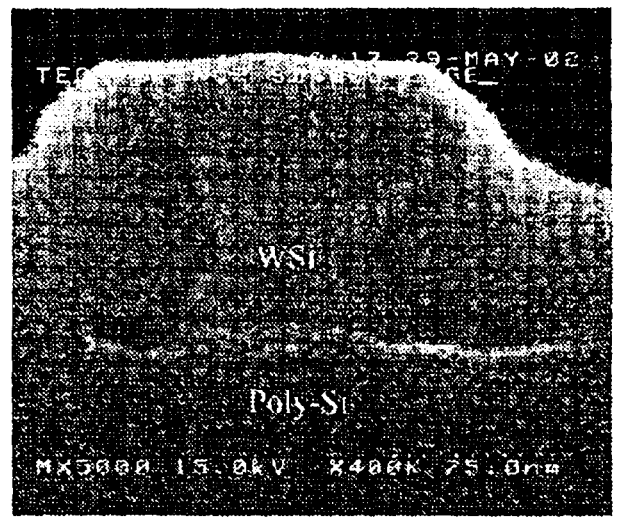
FIG. 2 shows a TEM image of a cross section of the polysilicon/tungsten silicide gate after the re-oxidation process of this invention.
Figure 3:
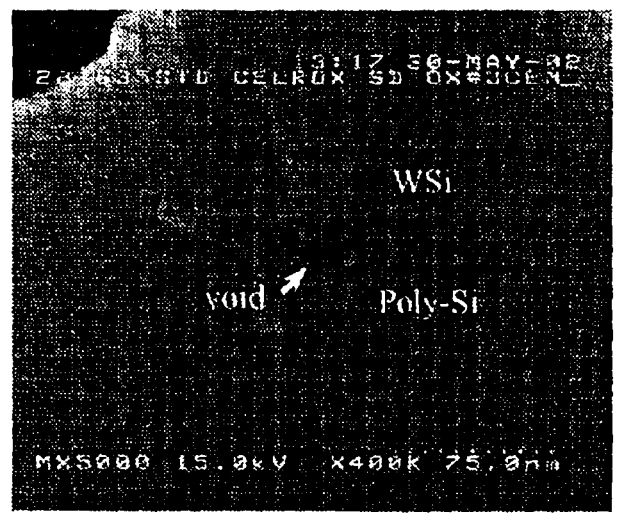
FIG. 3 shows a TEM image of a cross section of a polysilicon/tungsten silicide gate after the re-oxidation process in the prior art.

Referring to FIG. 2, which shows a TEM image of a cross section of the polysilicon/tungsten silicide stacked structure after the re-oxidation process of this invention. According to FIG. 2, no void is observed at the interface between the tungsten silicide layer and the polysilicon layer.

Since the thin CVD oxide layer can prevent fast oxidation on exposed surfaces of the tungsten suicide layer and the polysilicon layer, pumping-up paths for underlying polysilicon are not created. Therefore, void formation at the polysilicon tungsten silicide interface can be prevented effectively, as shown in FIG. 2.

Moreover, the re-oxidation process of this invention is not only restricted to apply to a semiconductor device having polysilicon/tungsten suicide stacked structures (or Poly/WSi stacked gates), but also can be applied to a semiconductor device that has a stacked structure constituted of polysilicon and another metal suicide material. The invention is particularly useful if the interface between polysilicon and the metal silicide material is sensitive to fast oxidation on the surfaces of the polysilicon layer and the metal silicide layer.

It will be apparent to those skilled in the art that various modifications and variations can be made to the structure of the present invention without departing from the scope of spirit of the invention. In view of the foregoing, it is intended that the present invention cover modifications and variations of this invention provided they fall within the scope of the following claims and their equivalents.

What is claimed is:

1. A re-oxidation process of a semiconductor device, comprising:
    providing a substrate having a stacked structure thereon, wherein the stacked structure includes a polysilicon/tungsten silicide interface;
    forming a CVD oxide layer on both the substrate and the stacked structure with a chemical vapor deposition (CVD) process; and
    performing an oxidation process to form a thermal oxide layer on both the substrate and the stacked structure.

2. The re-oxidation process of claim 1, wherein the stacked structure includes a stacked gate that comprises, from bottom to top, a tunneling layer, a polysilicon floating gate, an inter-poly dielectric layer, a polysilicon control gate and a tungsten silicide layer.

3. The re-oxidation process of claim 1, wherein the stacked structure includes a stacked gate that comprises, from bottom to top, a gate dielectric layer, a polysilicon gate and a tungsten silicide layer.

4. The re-oxidation process of claim 1, wherein the CVD process is a low-pressure chemical vapor deposition (LPCVD) process or a plasma-enhanced chemical vapor deposition (PECVD) process.

5. The re-oxidation process of claim 1, wherein the CVD oxide layer is formed using silane ($SiH_4$), tetraethyl-orthosilane (TEOS) or dichiorosilane ($SiH_2Cl_2$) as a Si-source.

6. The re-oxidation process of claim 1, wherein the CVD oxide layer has a thickness from 30 Å to 120 Å.

7. The re-oxidation process of claim 1, wherein the oxidation process is conducted under $O_2$, $H_2O$ or $O_2/H_2O$ atmosphere.

8. The re-oxidation process of claim 1, wherein the oxidation process is conducted in a batch-type or single wafer-type reaction chamber.

9. A method for fabricating a semiconductor device, comprising:
    sequentially forming a tunneling layer, a first polysilicon layer, an inter-poly dielectric layer, a second polysilicon layer and a tungsten silicide layer on a substrate;
    sequentially patterning the tungsten silicide layer, the second polysilicon layer, the inter-poly dielectric layer and the first polysilicon layer to form a stacked gate;
    forming a CVD oxide layer on both the substrate and the stacked gate with a chemical vapor deposition (CVD) process; and
    performing an oxidation process to form a thermal oxide layer on both the substrate and the stacked gate.

10. The method of claim 9, wherein the CVD) process is a low-pressure chemical vapor deposition (LPCVD) process or a plasma-enhanced chemical vapor deposition (PECVD) process.

11. The method of claim 9, wherein the CVD oxide layer is formed using silane ($SiH_4$), tetraethyl-ortho-silane (TEOS) or dichlorosilane ($SiH_2Cl_2$) as a Si-source.

12. The method of claim 9, wherein the CVD oxide layer has a thickness from 30 Å to 120 Å.

13. The method of claim 9, wherein the oxidation process is conducted under $O_2$, $H_2O$ or $O_2/H_2O$ atmosphere.

14. The method of claim 9, wherein the oxidation process is conducted in a batch-type or single wafer-type reaction chamber.

15. A re-oxidation process of a semiconductor device, comprising:
    providing a substrate having a stacked structure thereon, wherein the stacked structure includes a polysilicon/metal silicide interface;
    forming a CVD oxide layer on both the substrate and the stacked structure with a chemical vapor deposition (CVD) process; and
    performing an oxidation process to form a thermal oxide layer on both the substrate and the stacked structure.

16. The re-oxidation process of claim 15, wherein the stacked structure includes a stacked gate that comprises, from bottom to top, a tunneling layer, a polysilicon floating gate, an inter-poly dielectric layer, a polysilicon control gate and a metal silicide layer.

17. The re-oxidation process of claim 15, wherein the stacked structure includes a stacked gate that comprises, from bottom to top, a gate dielectric layer, a polysilicon gate and a metal silicide layer.

18. The re-oxidation process of claim 15, wherein the CVD process is a low pressure chemical vapor deposition (LPCVD) process or a plasma enhanced chemical vapor deposition (PECVD) process.

19. The re-oxidation process of claim 15, wherein the CVD oxide layer is formed using $SiH_4$, tetraethyl-orthosilane (TEOS) or dichlorosilane ($SiH_2Cl_2$) as a Si-source.

20. The re-oxidation process of claim 15, wherein the CVD oxide layer has a thickness from 30 Å to 120 Å.

* * * * *